(12) United States Patent
Kim et al.

(10) Patent No.: US 7,876,041 B2
(45) Date of Patent: Jan. 25, 2011

(54) ORGANIC LIGHT EMITTING DISPLAY DEVICE

(75) Inventors: Jung-Yeon Kim, Hwaseong-si (KR); Sang-Woo Lee, Hwaseong-si (KR); Jung-Soo Rhee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 186 days.

(21) Appl. No.: 12/328,463

(22) Filed: Dec. 4, 2008

(65) Prior Publication Data
US 2009/0267486 A1 Oct. 29, 2009

(30) Foreign Application Priority Data
Apr. 25, 2008 (KR) .............. 10-2008-0038680

(51) Int. Cl.
*H01J 1/62* (2006.01)
(52) U.S. Cl. .................... 313/506; 313/504
(58) Field of Classification Search .......... 313/498, 313/504, 506, 509
See application file for complete search history.

(56) References Cited

U.S. PATENT DOCUMENTS 7,057,339 B2 * 6/2006 Boroson et al. ........... 313/504
7,589,463 B2 * 9/2009 Murano et al. ........... 313/506

* cited by examiner

*Primary Examiner*—Vip Patel
(74) *Attorney, Agent, or Firm*—Innovation Counsel LLP

(57) ABSTRACT

An organic light emitting display device according to one or more embodiments is provided. An organic light emitting display device according to an exemplary embodiment of the present invention includes a reinforcement member disposed on a substrate and having a refractive index of greater than about 2.1, a transflective electrode disposed on the reinforcement member and contacting the reinforcement member, a pixel electrode disposed on the transflective electrode and contacting the transflective electrode, an organic light emitting member disposed on the pixel electrode, and a common electrode disposed on the organic light emitting member.

25 Claims, 6 Drawing Sheets

ORGANIC LIGHT EMITTING DISPLAY DEVICE

CROSS-REFERENCE TO RELATED APPLICATION

This application claims priority to and the benefit of Korean Patent Application No. 10-2008-0038680 filed in the Korean Intellectual Property Office on Apr. 25, 2008, the entire contents of which are incorporated herein by reference.

BACKGROUND (a) Technical Field

Embodiments of the present invention relate to an organic light emitting display device.

(b) Description of the Related Art

An organic light emitting display device includes a plurality of pixels, each including an organic light emitting element and a plurality of thin film transistors for driving the organic light emitting element.

An organic light emitting element includes an anode, a cathode, and an organic light emitting member disposed between the anode and the cathode. The organic light emitting member emits a light representing white or one of three primary colors such as red, green, or blue. The material of the organic light emitting member depends on the color of light to be emitted therefrom. An organic light emitting member emitting white light is usually formed by laminating light emitting materials emitting red, green, and blue lights such that the red, green, and blue lights are mixed to emit white light. Furthermore, when the organic light emitting member emits white light, a color filter is added to obtain light in a desired color.

However, optical characteristics of light emitted from pixels, such as wavelength or color purity, may not satisfy a desired condition due to material characteristics of the organic light emitting element or optical interference caused by thin films through which light passes.

SUMMARY

An organic light emitting display device according to an exemplary embodiment of the present invention includes a reinforcement member formed on a substrate and having a refractive index of greater than about 2.1, a transflective electrode formed on the reinforcement member and contacting the reinforcement member, a pixel electrode formed on the transflective electrode and contacting the transflective electrode, an organic light emitting member formed on the pixel electrode, and a common electrode formed on the organic light emitting member.

The refractive index of the reinforcement member may be equal to or greater than about 3.

The reinforcement member may include an inorganic material, particularly, a silicon compound, and more particularly, a metal-silicon compound. Examples of the metal-silicon compound include $Ir_xSi_y$, VSi, and ZrSi.

The thickness of the reinforcement member may be in a range of about 50 Å to about 1,000 Å.

The transflective electrode may include Al or Ag and may have a thickness in a range of about 150 Å to about 200 Å.

The pixel electrode may include ITO or IZO.

An organic light emitting display device according to another exemplary embodiment of the present invention includes a reinforcement member formed on a substrate and including a silicon compound, a transflective electrode formed on the reinforcement member and contacting the reinforcement member, a pixel electrode formed on the transflective electrode and contacting the transflective electrode, an organic light emitting member formed on the pixel electrode, and a common electrode formed on the organic light emitting member.

The reinforcement member may include a metal-silicon compound, for example, at least one of $Ir_xSi_y$, VSi, or ZrSi, the thickness of the reinforcement member may be in a range of about 50 Å to about 1,000 Å, and the refractive index of the reinforcement member may be equal to or greater than about 3.

The transflective electrode may include Al or Ag and may have a thickness in a range of about 150 Å to about 200 Å.

The pixel electrode may include ITO or IZO.

As described above, the optical characteristics of the organic light emitting display device may be improved and strengthened.

DETAILED DESCRIPTION

Figure 1:
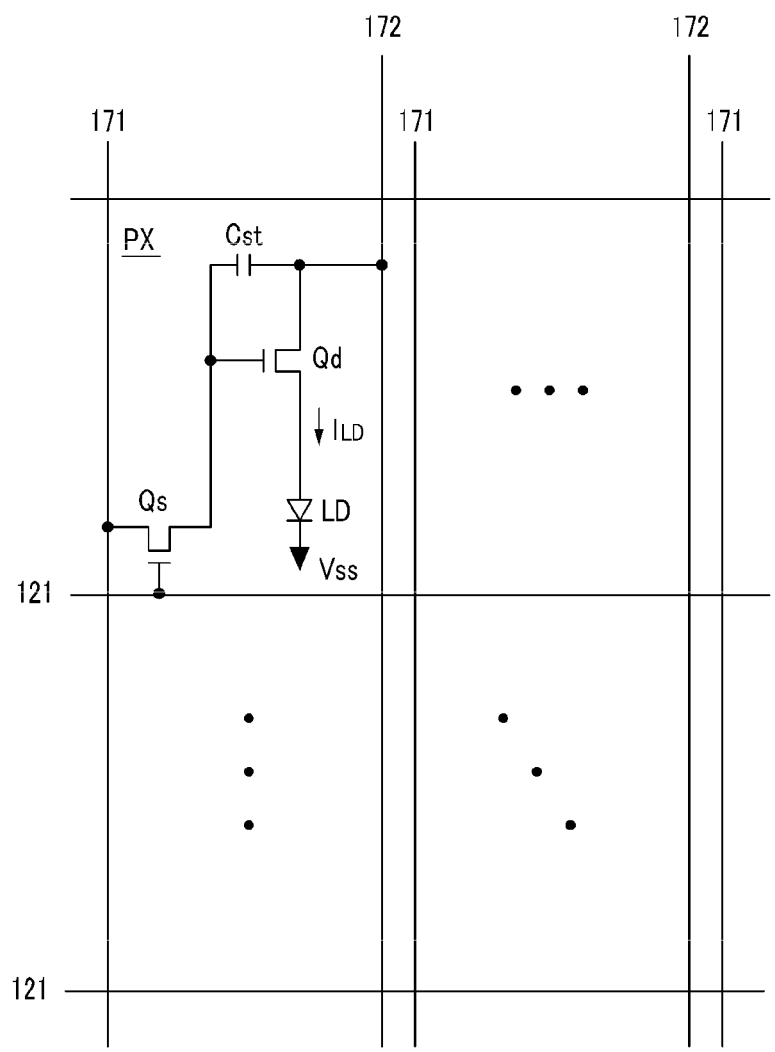
FIG. 1 is an equivalent circuit diagram of an organic light emitting display device according to an exemplary embodiment of the present invention.

The present disclosure will be described more fully hereinafter with reference to the accompanying drawings, in which exemplary embodiments of the invention are shown.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element, or intervening elements may also be present. In contrast, when an element is referred to as being "directly on" another element, there are no intervening elements present.

An organic light emitting display device according to an exemplary embodiment of the present invention will now be described in detail with reference to FIG. 1.

FIG. 1 is an equivalent circuit diagram of an organic light emitting display device according to an exemplary embodiment of the present invention.

Referring to FIG. 1, an organic light emitting display device according to an exemplary embodiment includes a plurality of signal lines 121, 171, and 172 and a plurality of pixels PX connected to the signal lines 121, 171, and 172 and arranged in a matrix form.

The signal lines include a plurality of gate lines 121 transmitting gate signals (or scanning signals), a plurality of data lines 171 transmitting data signals, and a plurality of driving voltage lines 172 transmitting a driving voltage. The gate lines 121 extend in a row direction and are arranged in parallel to each other. The data lines 171 extend in a column direction and are arranged in parallel to each other. Although the driving voltage lines 172 extend in a column direction in the embodiment of FIG. 1, the driving voltage lines 172 may extend in a row direction or a column direction, or may be arranged in a mesh form.

Each of the pixels PX includes a switching transistor Qs, a driving transistor Qd, a storage capacitor Cst, and an organic light emitting element LD.

The switching transistor Qs includes a control terminal connected to a gate line 121, an input terminal connected to a data line 171, and an output terminal connected to the driving transistor Qd. The switching transistor Qs transmits a data signal received from the data line 171 to the driving transistor Qd in response to a scanning signal received from the gate line 121.

The driving transistor Qd includes a control terminal connected to the switching transistor Qs, an input terminal connected to a driving voltage line 172, and an output terminal connected to the organic light emitting element LD. The driving transistor Qd flows an output current $I_{LD}$ having a magnitude that varies depending on the voltage applied across the control terminal and the output terminal.

The storage capacitor Cst is connected between the control terminal and the input terminal of the driving transistor Qd. The storage capacitor Cst stores the data signal applied to the control terminal of the driving transistor Qd and maintains the stored data signal even after the switching transistor Qs is turned off.

The organic light emitting element LD may be an organic light emitting diode (OLED), for example, and includes an anode connected to the output terminal of the driving transistor Qd and a cathode connected to a common voltage Vss. The organic light emitting element LD emits light having an intensity depending on the output current $I_{LD}$ of the driving transistor Qd to display an image.

Although the switching transistor Qs and the driving transistor Qd are n-channel field effect transistors (FETs), at least one of the switching transistor Qs and the driving transistor Qd may be a p-channel FET. The connection relationship of the transistors Qs and Qd, the storage capacitor Cst, and the organic light emitting element LD may be changed.

Other transistors for compensating the threshold voltages of the driving transistor Qd and the organic light emitting element LD may be added to the switching transistor Qs and the driving transistor Qd.

The detailed structure of the organic light emitting display device illustrated in FIG. 1 is explained in more detail with reference to the embodiments of FIGS. 1 and 2.

Figure 2:
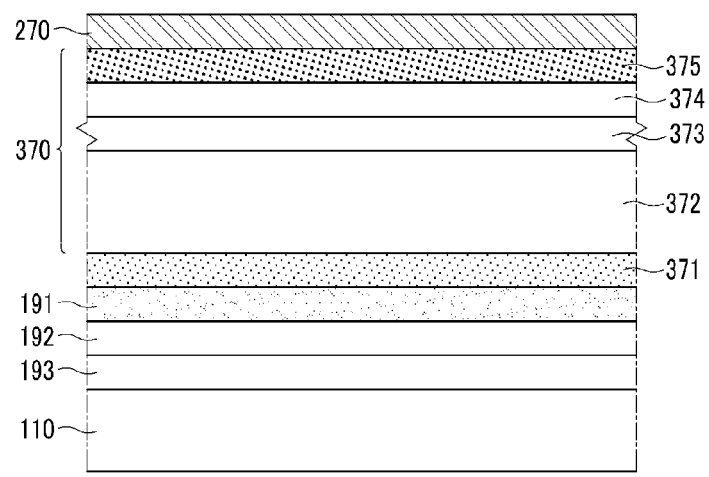
FIG. 2 is a cross-sectional view of the organic light emitting display device according to an exemplary embodiment of the present invention.

FIG. 2 is a cross-sectional view of the organic light emitting display device according to an exemplary embodiment of the present invention.

A reinforcement member 193 is formed on an insulation substrate 110 that may be made of transparent glass or plastic. The reinforcement member 193 may be formed of an inorganic material having a refractive index of greater than about 2.1, and more particularly, in some embodiments, the refractive index may be equal to or greater than about 3. The reinforcement member 193 may be formed of a silicon compound, particularly, a metal-silicon compound, for example, $Ir_xSi_y$, VSi, or ZrSi, that has refractive indices of equal to or greater than about 3. These materials may be deposited by sputtering, chemical vapor deposition, thermal evaporation, etc. The reinforcement member 193 may have a thickness of about 50 Å to about 1,000 Å.

A transflective electrode 192 is formed right on the reinforcement member 193. The transflective electrode 192 may be formed of a metal having high reflectance, such as Ag or Al, and may have a thickness of about 150 Å to about 200 Å. A thin metal layer has transflective characteristics that reflect or transmit incident light.

A pixel electrode 191 is formed on the transflective electrode 192. The pixel electrode 191 may be formed of ITO or IZO, and may have a thickness of about 300 Å to about 3000 Å.

An organic light emitting member 370 is formed on the pixel electrode 191.

The organic light emitting member 370 has a multi-layered structure including a hole injecting layer 371, a hole transport layer 372, an emission layer 373, an electron transport layer 374, and an electron injecting layer 375, which are sequentially deposited.

The emission layer 373 may be made of an organic material that emits light in one of three primary colors, for example, red, green, and blue, and the layers other than the emission layer 373 improve the light-emitting efficiency of the emission layer 373. The hole transport layer 372 and the electron transport layer 374 balance electrons with holes, and the hole injecting layer 371 and the electron injecting layer 373 reinforce injection of electrons and holes.

A common electrode 270 that transmits the common voltage Vss is formed on the organic light emitting member 370. The common electrode 270 may be formed of a reflective metal such as Ca, Ba, Mg, Al, or Ag.

In this organic light emitting display device according to an embodiment, the pixel electrode 191, the organic light emitting member 370 and the common electrode 270 form an organic light emitting element LD. The pixel electrode 191 functions as an anode, and the common electrode 270 functions as a cathode.

The organic light emitting display device emits light from the bottom face of the substrate 110 to display images. Light emitted from the organic light emitting member 370 to the substrate 110 passes through the pixel electrode 191 to reach the transflective electrode 192. The transflective electrode 192 reflects the incident light to the common electrode 270, and the common electrode 270 reflects the light to the transflective electrode 192. When the light running between the transflective electrode 192 and the common electrode 270 goes through an optical process, such as interference, and satisfies an appropriate condition, the light passes through the transflective electrode 192 and the reinforcement member 193 to go out of the organic light emitting display device.

Here, the path of light depends on the thicknesses of the thin films disposed between the transflective electrode 192 and the common electrode 270, and thus light having desired optical characteristics, for example, light having a wavelength and color purity in desired ranges, may be obtained if the thicknesses of the thin films are appropriately selected. For example, light with a desired wavelength may be obtained by varying the thickness of the hole transport layer 372 of the organic light emitting member 370 according to the color of light emitted from the emission layer 373. For example, the hole transport layer 372 is the thickest when the emission layer 373 emits red light, thinnest when the emission layer emits 373 green light, and has an intermediate thickness when the emission layer 373 emits blue light.

However, luminance of projected light may be decreased when the transflective electrode 192 is too thick and desired optical characteristics may not be obtained when the transflective electrode 192 is too thin, and thus, the transflective electrode 192 may have a thickness in the range of about 150 Å to about 200 Å, as described above.

That is, the luminance of light that has passed through the transflective electrode 192 is strengthened by the reinforcement member 193. Particularly, when the refractive index of the reinforcement member 193 is greater than that of IZO, as in the present exemplary embodiment, a degree of luminance enhancement may be further increased.

Figure 3:
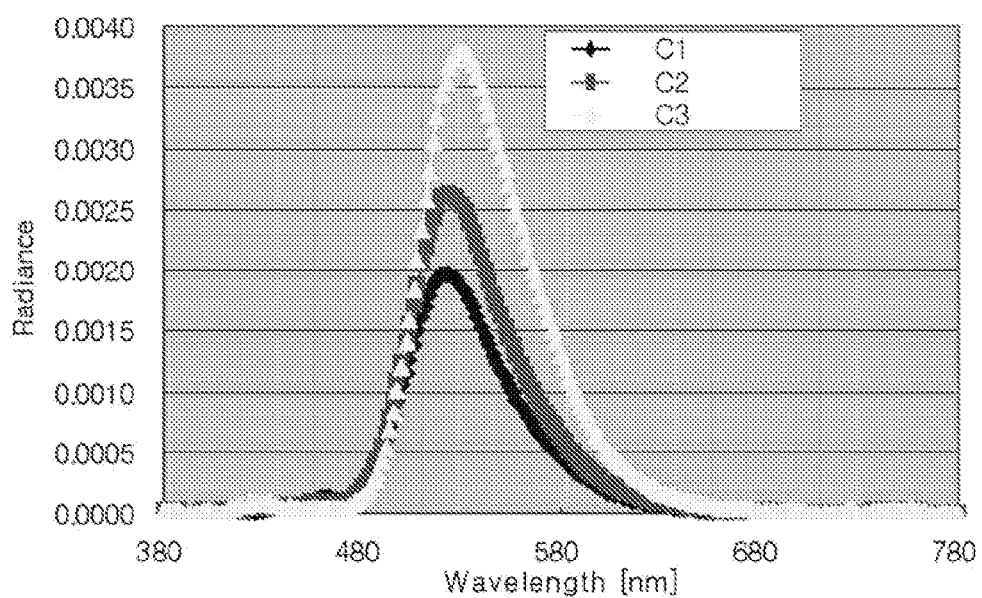
FIGS. 3 and 4 are graphs showing radiance according to a reinforcement member in the organic light emitting display device.

FIG. 3 is a graph showing radiance of a green pixel in a case C1 where there is no reinforcement member, in a case C2 where the reinforcement member 193 is formed of IZO, and in a case C3 where the reinforcement member 193 is formed of a material having a refractive index greater than that of IZO. The thickness of the reinforcement member 193 was about 300 Å in the case C2, and about 100 Å to about 200 Å in the case C3. The refractive index of IZO is about 1.7 to about 2.1 and radiance is defined in watt/steradian/nm.

As shown in FIG. 3, the radiance at the peak in the case C2 having the reinforcement member 193 of IZO is greater than that in the case C1 having no reinforcement member, and the radiance at the peak in the case C3 having the reinforcement member 193 of a material having a refractive index higher than the IZO is much greater than that in the case C2.

Figure 4:
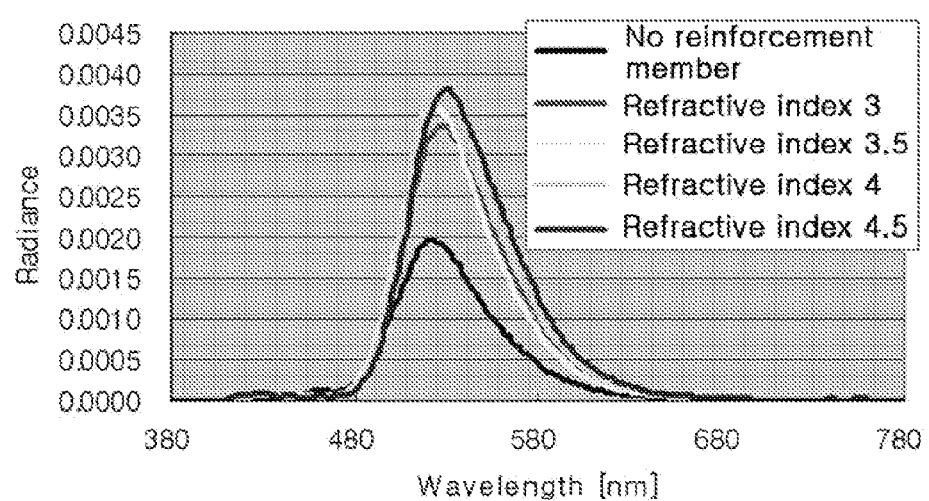

When the refractive index of the reinforcement member 193 is equal to or greater than about 3, the radiance is further increased as shown in FIG. 4. FIG. 4 is a graph showing radiance as a function of refractive index. Referring to FIG. 4, radiance remarkably increases when the refractive index is equal to or greater than about 3, and the degree of radiance increase is mitigated when the refractive index is much higher than about 3. Particularly, the radiance when the refractive index is about 4.5 is lower than the radiance when the refractive index is about 4.

An example of the detailed structure of the organic light emitting display device shown in the embodiment of FIG. 2 is described with reference to FIGS. 5 and 6.

Figure 5:
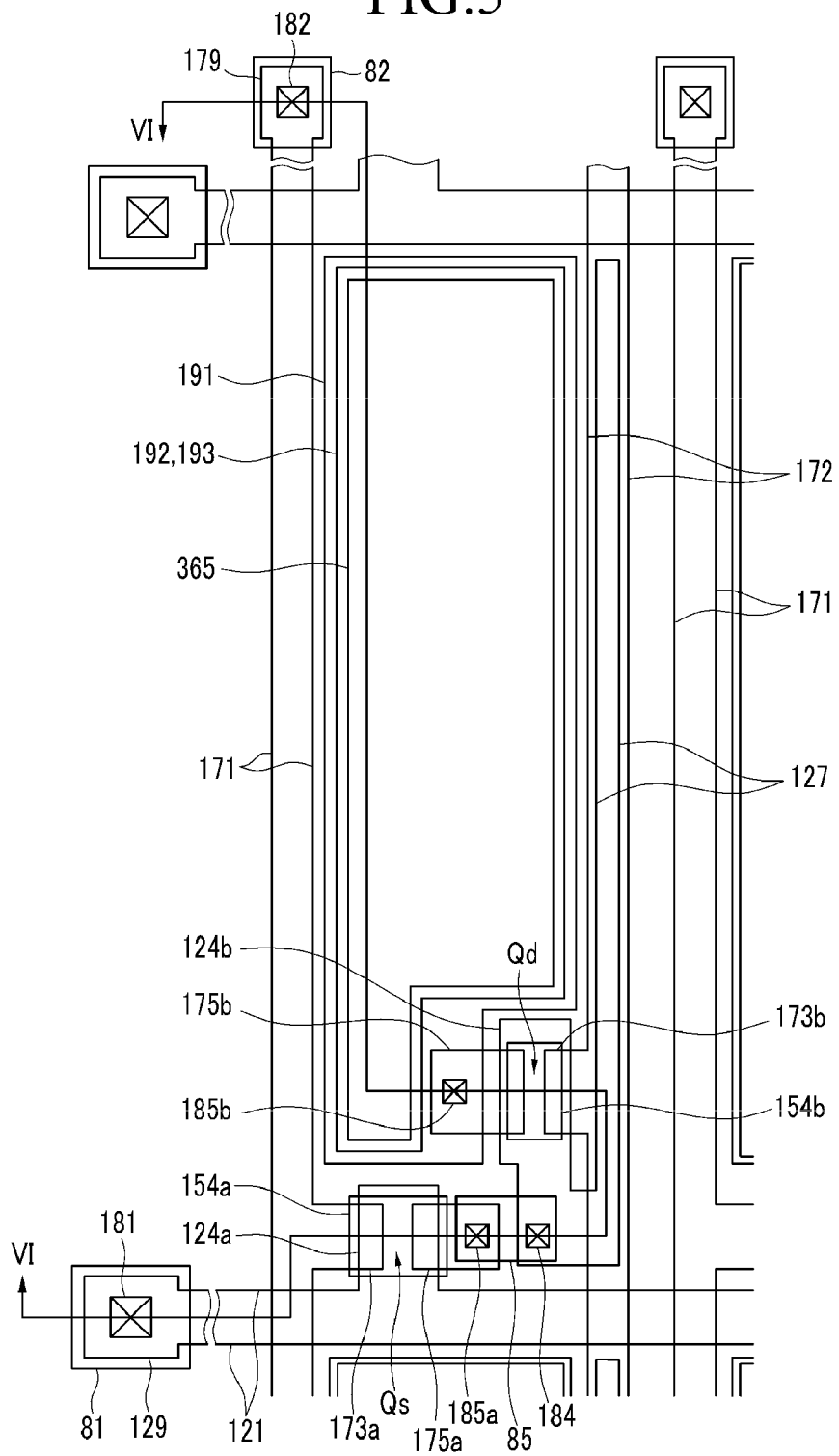
FIG. 5 is a layout view of the organic light emitting display device according to an exemplary embodiment of the present invention.
Figure 6:
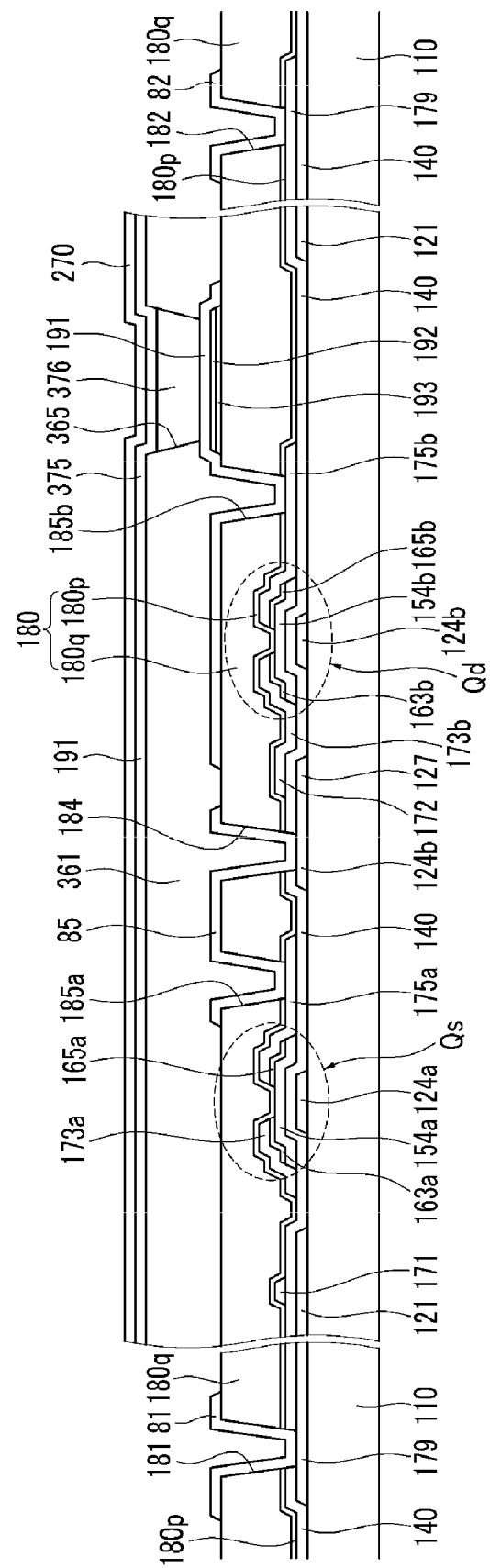
FIG. 6 is a cross-sectional view of the organic light emitting display device taken along line VI-VI of FIG. 5.

FIG. 5 is a layout view of the organic light emitting display device according to an exemplary embodiment of the present invention and FIG. 6 is a cross-sectional view of the organic light emitting display device shown in FIG. 5, taken along line VI-VI of FIG. 5.

A gate line 121 including a first control electrode 124a, and a second control electrode 124b are formed on the insulation substrate 110 that may be made of transparent glass or plastic.

The gate line 121 extends in a transverse direction and the first control electrode 124a protrudes upwardly from the gate line 121. The gate line 121 includes a wide end portion 129 connected with another layer or an external driving circuit.

The second control electrode 124b is spaced apart from the gate line 121 and includes a storage electrode 127 extending in a longitudinal direction.

A gate insulating layer 140 that may be formed of silicon oxide or silicon nitride is formed on the gate line 121 and the second control electrode 124b.

First and second semiconductor islands 154a and 154b that may be formed of hydrogenated amorphous silicon are formed on the gate insulating layer 140. The first semiconductor island 154a is located on the first control electrode 124a, and the second semiconductor island 154b is located on the second control electrode 124b.

A pair of first ohmic contacts 163a and 165a are formed on the first semiconductor island 154a, and a pair of second ohmic contacts 163b and 165b are formed on the second semiconductor island 154b. The ohmic contacts 163a, 163b, 165a, and 165b have an island shape and may be formed of a material such as n+hydrogenated amorphous silicon heavily doped with an n-type impurity such as phosphorus.

A data line 171, a driving voltage line 172, and first and second output electrodes 175a and 175b are formed on the ohmic contacts 163a, 163b, 165a, and 165b and the gate insulating layer 140.

The data line 171 and the driving voltage line 172 extend in the longitudinal direction and intersect the gate line 121. The data line 171 includes a first input electrode 173a extending toward the first control electrode 142a and a wide end portion 179 and the driving voltage line 172 includes a second input electrode 173b extending toward the second control electrode 124b.

The first and second output electrodes 175a and 175b are separated from each other, and also separated from the data line 171 and the driving voltage line 172. The first input electrode 173a and the first output electrode 175a are disposed opposite to each other with respect to the first control electrode 124a, and the second input electrode 173b and the second output electrode 175b are disposed opposite to each other with respect to the second control electrode 124.

The ohmic contacts 163a, 163b, 165a, and 165b are interposed only between the semiconductor islands 154a and 154b and the overlying conductors 171, 172, 175a, and 175b and reduce contact resistance therebetween. The semiconductor islands 154a and 154b have exposed portions that are not covered with the input electrodes 173a and 173b and the output electrodes 175a and 175b.

The first control electrode 124a, the first input electrode 173a, and the first output electrode 175a form a switching thin film transistor (TFT) Qs together with the first semiconductor island 154a, and the second control electrode 124b, the second input electrode 173b, and the second output electrode 175b form a driving TFT Qd together with the second semiconductor island 154b.

The structures of the aforementioned switching transistor Qs, the driving transistor Qd, the gate line 121, the data line 171, and the driving voltage line 172 are exemplary and they may have various modifications.

A passivation layer 180 is formed on the data line 171, the driving voltage line 172, the output electrodes 175a and 175b, and the exposed portions of the semiconductor islands 154a and 154b. The passivation layer 180 includes a lower layer 180p that may be formed of an inorganic insulator such as silicon nitride or silicon oxide, and an upper layer 180q that may be formed of an organic insulator. The organic insulator may have a dielectric constant of equal to or less than 4.0 and photosensitivity, and may provide a flat face. The passivation layer 180 may have a single-layered structure made of an inorganic insulator or an organic insulator.

The passivation layer 180 has a contact hole 182 exposing the end portion 179 of the data line 171 and contact holes 185a and 185b exposing the first and second output electrodes 175a and 175b, respectively. The passivation layer 180 and the gate insulating layer 140 have a contact hole 181 exposing the end portion 129 of the gate line 121 and a contact hole 184 exposing the second control electrode 124b.

A reinforcement member 193 is formed on the passivation layer 180 and a transflective electrode 192 is formed thereon. The reinforcement member 193 and the transflective electrode 192 have been described above in detail so that detailed explanation hereof will be omitted.

A pixel electrode 191, a connecting member 85, and contact assistants 81 and 82 are formed on the transflective electrode 192 and the passivation layer 180. The pixel electrode 191, the connecting member 85, and the contact assistants 81 and 82 may be formed of a transparent conductive material such as ITO or IZO.

The pixel electrode 191 is connected to the second output electrode 175b through the contact hole 185b, and the connecting member 85 is connected to the second control electrode 124b and the first output electrode 175a through the contact holes 184 and 185b.

The contact assistants 81 and 82 are respectively connected to the end portion 129 of the gate line 121 and the end portion 179 of the data line 171 through the contact holes 181 and 182. The contact assistants 81 and 82 enhance adhesion between the end portions 129 and 179 and an external device, and protect the end portions 129 and 179.

A partition 361 is formed on the passivation layer 180. The partition 361 surrounds the pixel electrode 191 in the form of a bank to define an opening 365 and is made of an organic insulator or an inorganic insulator. The partition 361 may be formed of photoresist including black pigment and, in this case, the partition 361 functions as a light blocking member and is formed by a simple process.

An organic emission lower member 376 is formed in the opening 365 on the pixel electrode 191 defined by the partition 361. The organic emission lower member 376 includes the layers other than the electron injecting layer shown in the embodiment of FIG. 2, that is, a hole injecting layer 371, a hole transport layer 372, an emission layer 373, and an electron transport layer 374.

An electron injecting layer 375 is formed on the organic emission lower member 376 and the partition 361, and the common electrode 270 is formed thereon. The common electrode 270 may be formed of a reflective metal such as Ca, Ba, Mg, Al, or Ag. The electron injecting layer 375 and the common electrode 270 may be commonly used by multiple pixels.

Embodiments of the present invention may be applied to organic light emitting display devices having other structures.

While practical exemplary embodiments have been described, it is to be understood that the disclosure is not limited to the disclosed embodiments, but, on the contrary, is intended to cover various modifications and equivalent arrangements included within the spirit and scope of the appended claims.

What is claimed is:

1. An organic light emitting display device comprising:
a reinforcement member disposed on a substrate and comprising a refractive index of greater than about 2.1;
a transflective electrode disposed on the reinforcement member and contacting the reinforcement member;
a pixel electrode disposed on the transflective electrode and contacting the transflective electrode;
an organic light emitting member disposed on the pixel electrode; and
a common electrode disposed on the organic light emitting member.

2. The organic light emitting display device of claim 1, wherein the refractive index of the reinforcement member is equal to or greater than about 3.

3. The organic light emitting display device of claim 2, wherein the reinforcement member comprises an inorganic material.

4. The organic light emitting display device of claim 3, wherein the reinforcement member comprises a metal-silicon compound.

5. The organic light emitting display device of claim 4, wherein the reinforcement member comprises at least one of $Ir_xSi_y$, VSi, or ZrSi.

6. The organic light emitting display device of claim 5, wherein the thickness of the reinforcement member is in a range of about 50 Å to about 1,000 Å.

7. The organic light emitting display device of claim 5, wherein the transflective electrode comprises Al or Ag.

8. The organic light emitting display device of claim 7, wherein the transflective electrode has a thickness in a range of about 150 Å to about 200 Å.

9. The organic light emitting display device of claim 7, wherein the pixel electrode comprises ITO or IZO.

10. The organic light emitting display device of claim 1, wherein the reinforcement member comprises an inorganic material.

11. The organic light emitting display device of claim 10, wherein the reinforcement member comprises a metal-silicon compound.

12. The organic light emitting display device of claim 11, wherein the reinforcement member comprises at least one of $Ir_xSi_y$, VSi, or ZrSi.

13. The organic light emitting display device of claim 12, wherein the reinforcement member has a thickness in a range of about 50 Å to about 1,000 Å.

14. The organic light emitting display device of claim 1, wherein the reinforcement member comprises an inorganic material having a refractive index greater than a refractive index of IZO.

15. An organic light emitting display device comprising:
a reinforcement member disposed on a substrate and including a silicon compound;
a transflective electrode disposed on the reinforcement member and contacting the reinforcement member;
a pixel electrode disposed on the transflective electrode and contacting the transflective electrode;
an organic light emitting member disposed on the pixel electrode; and
a common electrode disposed on the organic light emitting member.

16. The organic light emitting display device of claim 15, wherein the reinforcement member comprises a metal-silicon compound.

17. The organic light emitting display device of claim 16, wherein the reinforcement member comprises at least one of $Ir_xSi_y$, VSi, or ZrSi.

18. The organic light emitting display device of claim 17, wherein the reinforcement member has a thickness in a range of about 50 Å to about 1,000 Å.

19. The organic light emitting display device of claim 15, wherein the refractive index of the reinforcement member is equal to or greater than about 2.1.

20. The organic light emitting display device of claim 15, wherein the transflective electrode comprises Al or Ag.

21. The organic light emitting display device of claim 20, wherein the transflective electrode has a thickness in a range of about 150 Å to about 200 Å.

22. The organic light emitting display device of claim 21, wherein the pixel electrode comprises ITO or IZO.

23. An organic light emitting display device comprising:
a transflective electrode disposed on a substrate;
a pixel electrode disposed on the transflective electrode and contacting the transflective electrode;
an organic light emitting member disposed on the pixel electrode;
a common electrode disposed on the organic light emitting member; and
a reinforcement member disposed between the substrate and the transflective electrode and having a refractive index greater than a refractive index of the pixel electrode.

24. The organic light emitting display device of claim 23, wherein the pixel electrode comprises ITO or IZO.

25. The organic light emitting display device of claim 24, wherein the refractive index of the pixel electrode is about 1.7.

* * * * *